US012046875B2

(12) United States Patent
Fujita et al.

(10) Patent No.: US 12,046,875 B2
(45) Date of Patent: Jul. 23, 2024

(54) QUANTUM CASCADE LASER DEVICE

(71) Applicant: HAMAMATSU PHOTONICS K.K., Hamamatsu (JP)

(72) Inventors: Kazuue Fujita, Hamamatsu (JP); Masahiro Hitaka, Hamamatsu (JP); Atsushi Sugiyama, Hamamatsu (JP); Kousuke Shibata, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/313,389

(22) Filed: May 6, 2021

(65) Prior Publication Data
US 2021/0351570 A1 Nov. 11, 2021

(30) Foreign Application Priority Data

May 8, 2020 (JP) .................. 2020-082429

(51) Int. Cl.
*H01S 5/34* (2006.01)
*H01S 5/042* (2006.01)
(Continued)

(52) U.S. Cl.
CPC .......... *H01S 5/3401* (2013.01); *H01S 5/0425* (2013.01); *H01S 5/0604* (2013.01);
(Continued)

(58) Field of Classification Search
None
See application file for complete search history.

(56) References Cited

U.S. PATENT DOCUMENTS 9,484,715 B2 * 11/2016 Fujita .................... H01S 5/0604
9,912,119 B2 * 3/2018 Ito ......................... H01S 5/0604
(Continued)

FOREIGN PATENT DOCUMENTS

CN 113629491 A * 11/2021 .......... H01S 5/0425
JP 2017-033981 A 2/2017
(Continued)

OTHER PUBLICATIONS

Fujita et al. ("Recent progress in terahertz difference-frequency quantum cascade laser sources"; Nanophotonics 2018; 7 (11): 1795-1817 (Year: 2018).*
(Continued)

*Primary Examiner* — Tod T Van Roy
(74) *Attorney, Agent, or Firm* — Faegre Drinker Biddle & Reath LLP

(57) ABSTRACT

A quantum cascade laser device includes a semiconductor substrate, an active layer provided on the semiconductor substrate, and an upper clad layer provided on a side of the active layer opposite to the semiconductor substrate side and having a doping concentration of impurities of less than $1 \times 10^{17}$ cm$^{-3}$. Unit laminates included in the active layer each include a first emission upper level, a second emission upper level, and at least one emission lower level in their subband level structure. The active layer is configured to generate light having a center wavelength of 10 μm or more due to electron transition between at least two levels of the first emission upper level, the second emission upper level, and the at least one emission lower level in the light emission layer in each of the unit laminates.

4 Claims, 6 Drawing Sheets

(51) Int. Cl.
  *H01S 5/06* (2006.01)
  *H01S 5/30* (2006.01)
  *H01S 5/028* (2006.01)
  *H01S 5/12* (2021.01)
  *H01S 5/22* (2006.01)

(52) U.S. Cl.
  CPC .......... *H01S 5/3086* (2013.01); *H01S 5/3402* (2013.01); *H01S 5/0287* (2013.01); *H01S 5/04257* (2019.08); *H01S 5/12* (2013.01); *H01S 5/22* (2013.01); *H01S 2302/02* (2013.01)

(56) References Cited

U.S. PATENT DOCUMENTS

| | | | | |
|---|---|---|---|---|
| 10,008,829 | B2* | 6/2018 | Dougakiuchi | .......... H01S 5/141 |
| 10,014,662 | B2* | 7/2018 | Fujita | ................ H01S 5/34306 |
| 10,439,363 | B2* | 10/2019 | Ito | ........................ H01S 5/028 |
| 2009/0213890 | A1* | 8/2009 | Patel | .................... B82Y 20/00 |
| | | | | 372/45.012 |
| 2010/0135337 | A1* | 6/2010 | Belkin | .................. B82Y 20/00 |
| | | | | 372/4 |
| 2011/0026556 | A1* | 2/2011 | Fujita | .................... B82Y 20/00 |
| | | | | 372/45.012 |
| 2014/0241392 | A1* | 8/2014 | Edamura | ................ B82Y 20/00 |
| | | | | 372/45.012 |
| 2015/0311665 | A1* | 10/2015 | Belkin | .................... H01S 5/12 |
| | | | | 372/20 |
| 2017/0033536 | A1* | 2/2017 | Fujita | ................ H01S 5/1096 |
| 2021/0305786 | A1* | 9/2021 | Fujita | ................ H01S 5/0604 |
| 2021/0351570 | A1* | 11/2021 | Fujita | .................... H01S 5/3401 |
| 2022/0209505 | A1* | 6/2022 | Fujita | ........................ H01S 5/02 |

FOREIGN PATENT DOCUMENTS

| | | | | |
|---|---|---|---|---|
| JP | 2018-046128 | A | 3/2018 | |
| JP | 2021177520 | A * | 11/2021 | ........... H01S 5/0425 |
| WO | WO-2021125240 | A1 * | 6/2021 | ........... H01S 5/3401 |
| WO | WO-2021200584 | A1 * | 10/2021 | |

OTHER PUBLICATIONS

Lu et al. ("Room temperature single mode terahertz sources based on intracavity difference frequency generation in quantum cascade lasers"; Appl. Phys. Lett. 99, 131106 (2011) (Year: 2011).*

Miriam Serena Vitiello et al., "Quantum cascade lasers: 20 years of challenges", Optics Express 5167, Feb. 23, 2015, vol. 23, No. 4, p. 5167-p. 5182.

Michel Rochat et al., "Long-wavelength (?? 16?m), room-temperature, single-frequency quantum-cascade lasers based on a bound-to-continuum transition.", Applied Physics Letters, Dec. 24, 2001, p. 4271-p. 4273.

Fujita K, Yamanishi M, Edamura T, Sugiyama A, Furuta S et al., "Extremely high T0-values (?450K) of long-wavelength (?15?m), low-threshold-current-density quantum-cascade lasers based on the indirect pump scheme", Applied Physics Letters 97, Nov. 18, 20101, p. 201109-1-p. 201109-3.

Huang X, Charles WO, Gmachl C. et al., "Temperature-insensitive long-wavelength (??14?m) Quantum Cascade lasers with low threshold.", 2011 Optical Society of America, Apr. 25, 2011, p. 8297-p. 8302.

Fuchs P, Semmel J, Friedl J, Hofling S, Koeth J, Worschech L, Forchel A. et al., "Distributed feedback quantum cascade lasers at 13.8?m on indium phosphide.", Applied Physics Letters 98, May 26, 2011, p. 211118-1-p. 211118-3.

* cited by examiner

Fig. 5

| Semiconductor layer | | Composition | Thickness (nm) | Doping |
|---|---|---|---|---|
| | Injection barrier layer 171 | InAlAs | 3.4 | undoped |
| Emission layer 17 | Well layer 161 | InGaAs | 4.3 | undoped |
| | Barrier layer 172 | InAlAs | 2.0 | undoped |
| | Well layer 162 | InGaAs | 9.3 | undoped |
| | Barrier layer 173 | InAlAs | 0.9 | undoped |
| | Well layer 163 | InGaAs | 7.6 | undoped |
| | Barrier layer 174 | InAlAs | 1.0 | undoped |
| | Well layer 164 | InGaAs | 6.2 | undoped |
| Injection layer 18 | Exit barrier layer 191 | InAlAs | 1.1 | undoped |
| | Well layer 181 | InGaAs | 5.4 | undoped |
| | Barrier layer 192 | InAlAs | 1.2 | undoped |
| | Well layer 182 | InGaAs | 5.1 | undoped |
| | Barrier layer 193 | InAlAs | 1.3 | undoped |
| | Well layer 183 | InGaAs | 4.6 | undoped |
| | Barrier layer 194 | InAlAs | 1.5 | Si doped:$1.9 \times 10^{17}/cm^3$ |
| | Well layer 184 | InGaAs | 4.5 | Si doped:$1.9 \times 10^{17}/cm^3$ |
| | Barrier layer 195 | InAlAs | 1.7 | Si doped:$1.9 \times 10^{17}/cm^3$ |
| | Well layer 185 | InGaAs | 4.5 | Si doped:$1.9 \times 10^{17}/cm^3$ |
| | Barrier layer 196 | InAlAs | 2.2 | undoped |
| | Well layer 86 | InGaAs | 4.5 | undoped |
| | Barrier layer 197 | InAlAs | 2.7 | undoped |
| | Well layer 187 | InGaAs | 4.4 | undoped |

QUANTUM CASCADE LASER DEVICE

TECHNICAL FIELD

The present disclosure relates to a quantum cascade laser device.

BACKGROUND

Light in a mid-infrared wavelength region (for example, wavelength 5 to 30 μm) is an important wavelength region in spectroscopic analysis technology. As a semiconductor light source capable of outputting light in such a wavelength region, a quantum cascade laser (QCL) device is known (see, for example, Non-Patent Documents 1 to 5).

(Non-Patent Document 1) Vitiello M S, Scalari G, Williams B, De Natale P. Quantum cascade lasers: 20 years of challenges. Optics express. 2015 Feb. 23; 23(4): 5167-5182.

(Non-Patent Document 2) Michel Rochat, Daniel Hofstetter, Mattias Beck, and Jerome Faist. Long-wavelength ($\lambda\approx16$ μm), room-temperature, single-frequency quantum-cascade lasers based on a bound-to-continuum transition. Applied Physics Letters 2001; 79:4271-73.

(Non-Patent Document 3) Fujita K, Yamanishi M, Edamura T, Sugiyama A, Furuta S. Extremely high $T_0$-values (~450 K) of long-wavelength (~15 μm), low-threshold-current-density quantum-cascade lasers based on the indirect pump scheme. Applied Physics Letters 2010; 97:201109.

(Non-Patent Document 4) Huang X, Charles W O, Gmachl C. Temperature-insensitive long-wavelength ($\lambda\approx14$ μm) Quantum Cascade lasers with low threshold. Optics express 2011; 19:8297-302.

(Non-Patent Document 5) Fuchs P, Semmel J, Friedl J, Hofling S, Koeth J, Worschech L, Forchel A. Distributed feedback quantum cascade lasers at 13.8 μm on indium phosphide. Applied Physics Letters 2011; 98:211118.

SUMMARY

As disclosed in Non-Patent Document 1, it has been difficult to realize high light output performance (slope efficiency) in a wavelength band having a center wavelength of 10 μm or more with a conventional quantum cascade laser device. For example, Non-Patent Document 2 discloses a quantum cascade laser device having an active layer of a bound-to-continuum (BTC) structure, but its slope efficiency is about 20 mW/A. Also, Non-Patent Document 3 discloses a quantum cascade laser device having an active layer of indirect injection excitation (iDP), but its slope efficiency is about 346 mW/A. Non-Patent Document 4 discloses a quantum cascade laser device having an active layer of a two phonon-continuum structure, but its slope efficiency is about 375 mW/A. Non-Patent Document 5 discloses a quantum cascade laser device having an active layer of a BTC structure as in Non-Patent Document 1, but its slope efficiency is about 200 mW/A.

Therefore, one aspect of the present disclosure is to provide a quantum cascade laser device in which slope efficiency can be effectively improved.

A quantum cascade laser device according to one aspect of the present disclosure includes a semiconductor substrate, an active layer provided on the semiconductor substrate and in which a cascade structure in which a light emission layer and an injection layer are alternately laminated is formed by laminating a unit laminate including the light emission layer and the injection layer in multiple stages, and a first clad layer provided on a side of the active layer opposite to the semiconductor substrate side and having a doping concentration of impurities of less than $1\times10^{17}$ cm$^{-3}$, in which the unit laminates included in the active layer each include, in their subband level structure, a first emission upper level, a second emission upper level having an energy level higher than that of the first emission upper level, and at least one emission lower level having an energy level lower than that of the first emission upper level, and the active layer is configured to generate light having a center wavelength of 10 μm or more due to electron transition between at least two levels of the first emission upper level, the second emission upper level, and the at least one emission lower level in the light emission layer in each of the unit laminates.

In the quantum cascade laser device described above, the doping concentration of impurities in the first clad layer adjacent to the active layer is set to less than $1\times10^{17}$ cm$^{-3}$. When the doping concentration of impurities in the first clad layer is reduced to be low as described above, an amount of light generated in the active layer absorbed by the first clad layer by free carrier absorption can be effectively reduced. On the other hand, when the doping concentration of impurities in the first clad layer is lowered, since conductivity thereof deteriorates, there is a disadvantage in that it becomes difficult for a current to flow in the active layer via the first clad layer. Therefore, in the quantum cascade laser device described above, a subband level structure (a so-called dual-upper-level structure (DAU: dual-upper-state design)) having the first emission upper level, the second emission upper level, and at least one emission lower level is employed as the active layer structure to compensate for such a disadvantage. In this subband level structure, a relatively low threshold current density is realized by the structure in which sufficient carriers are supplied to both of the two emission upper levels. That is, when the DAU structure is employed, decrease in an amount of current caused by lowering the doping concentration of impurities in the first clad layer can be tolerated. As described above, when the DAU structure is employed and the doping concentration of impurities in the first clad layer is lowered, it is possible to effectively improve a slope efficiency of light (light having a center wavelength of 10 μm or more) for which it has been difficult to obtain high light output performance (slope efficiency) in a conventional quantum cascade laser device.

A thickness of the first clad layer may be 5 μm or more. When the thickness of the first clad layer is sufficiently increased in this way, the light generated in the active layer can be effectively confined in the active layer. Thereby, light loss in the active layer can be more effectively suppressed, and further improvement in the slope efficiency can be achieved.

A doping concentration of impurities in the semiconductor substrate may be less than $1\times10^{17}$ cm$^{-3}$. Thereby, an amount of light absorbed by the free carrier absorption in the semiconductor substrate can be effectively reduced. As a result, the light loss in the active layer can be more effectively suppressed, and further improvement in the slope efficiency can be achieved.

The quantum cascade laser device described above may further include a second clad layer provided between the active layer and the semiconductor substrate and having a doping concentration of impurities of less than $1\times10^{17}$ cm$^{-3}$. When the second clad layer is provided between the active layer and the semiconductor substrate, the light generated in the active layer can be effectively confined in the active layer. Further, when the doping concentration of impurities is reduced to be low also in the second clad layer as in the first clad layer, the light loss in the active layer can be more effectively suppressed, and further improvement in the slope efficiency can be achieved.

A thickness of the second clad layer may be 5 μm or more. When the thickness of the second clad layer is sufficiently increased in this way, the light generated in the active layer can be more effectively confined in the active layer. Thereby, the light loss in the active layer can be more effectively suppressed, and further improvement in the slope efficiency can be achieved.

The quantum cascade laser device described above may further include a first electrode provided on a side in which the active layer is disposed with respect to the semiconductor substrate and electrically connected to the first clad layer, and a second electrode provided on a side opposite to the first electrode with the semiconductor substrate interposed therebetween and electrically connected to the semiconductor substrate. The doping concentration of impurities in the semiconductor substrate may be $5 \times 10^{15}$ cm$^{-3}$ or more and less than $1 \times 10^{17}$ cm$^{-3}$. In this case, when the electrodes (the first electrode and the second electrode) are disposed on both sides with the semiconductor substrate sandwiched therebetween, a current can be caused to flow in the active layer via the semiconductor substrate. Thereby, a manufacturing process of the quantum cascade laser device can be simplified compared to a structure (a so-called side contact structure) in which a current is caused to flow only in components on a side in which the active layer is provided with respect to the semiconductor substrate. Also, when the doping concentration in the semiconductor substrate is set to substrate may be $5 \times 10^{15}$ cm$^{-3}$ or more and less than substrate may be $1 \times 10^{17}$ cm$^{-3}$, a current required for driving the quantum cascade laser device can be appropriately caused to flow via the semiconductor substrate while reducing an amount of light absorbed by the free carrier absorption in the semiconductor substrate.

According to one aspect of the present disclosure, it is possible to provide a quantum cascade laser device in which slope efficiency can be effectively improved.

BRIEF DESCRIPTION OF THE DRAWINGS

FIG. 5 is a chart showing an example of a structure of the unit laminate for one cycle in the active layer.

DETAILED DESCRIPTION

Figure 1:
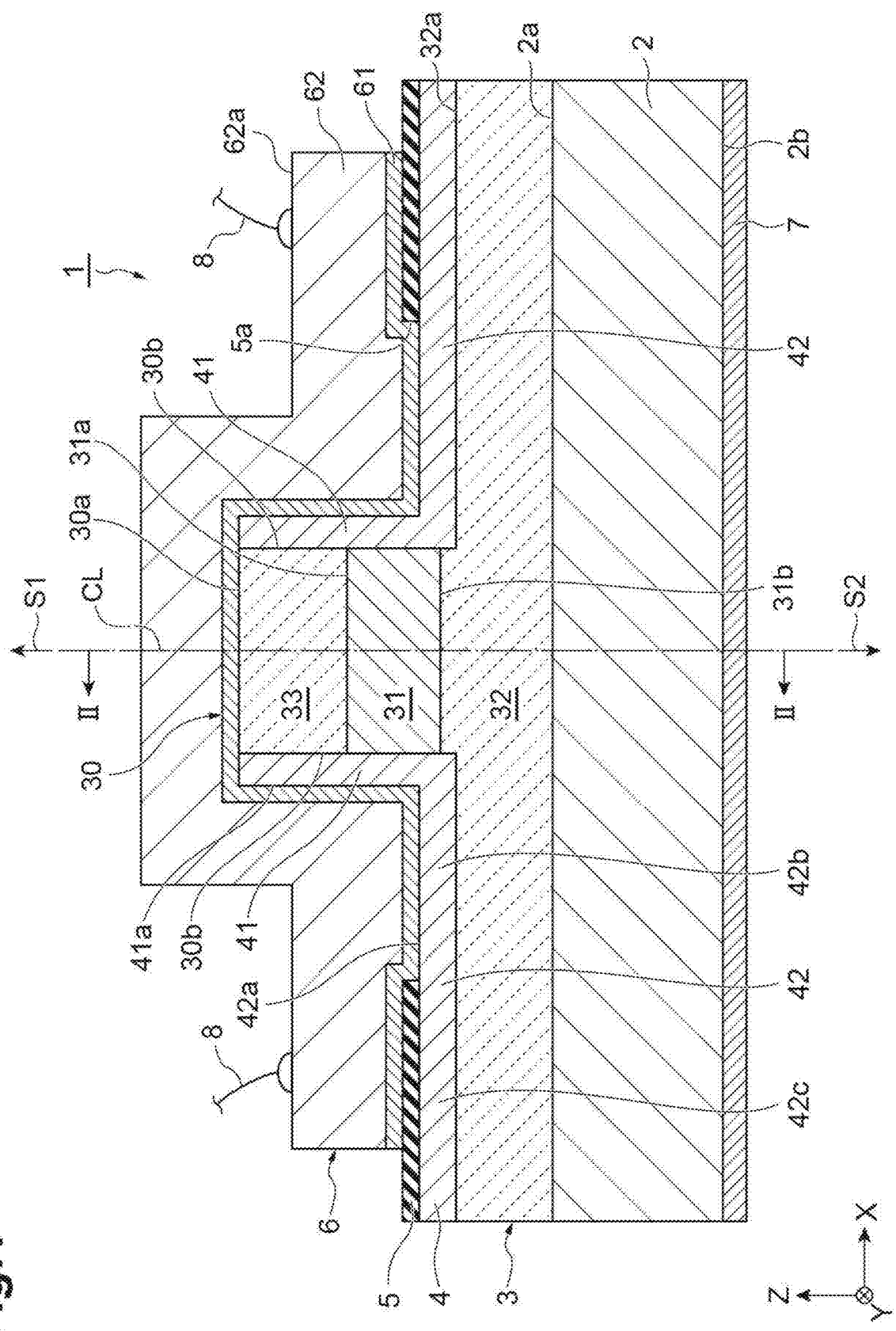
FIG. 1 is a cross-sectional view of a quantum cascade laser device according to one embodiment.

Hereinafter, embodiments of the present disclosure will be described in detail with reference to the drawings. In the description of the drawings, the same devices will be denoted by the same reference signs, and duplicate description thereof will be omitted. Further, dimensional proportions in the drawings do not necessarily coincide with the description used in the specification.

[Configuration of Quantum Cascade Laser Device]

Figure 2:
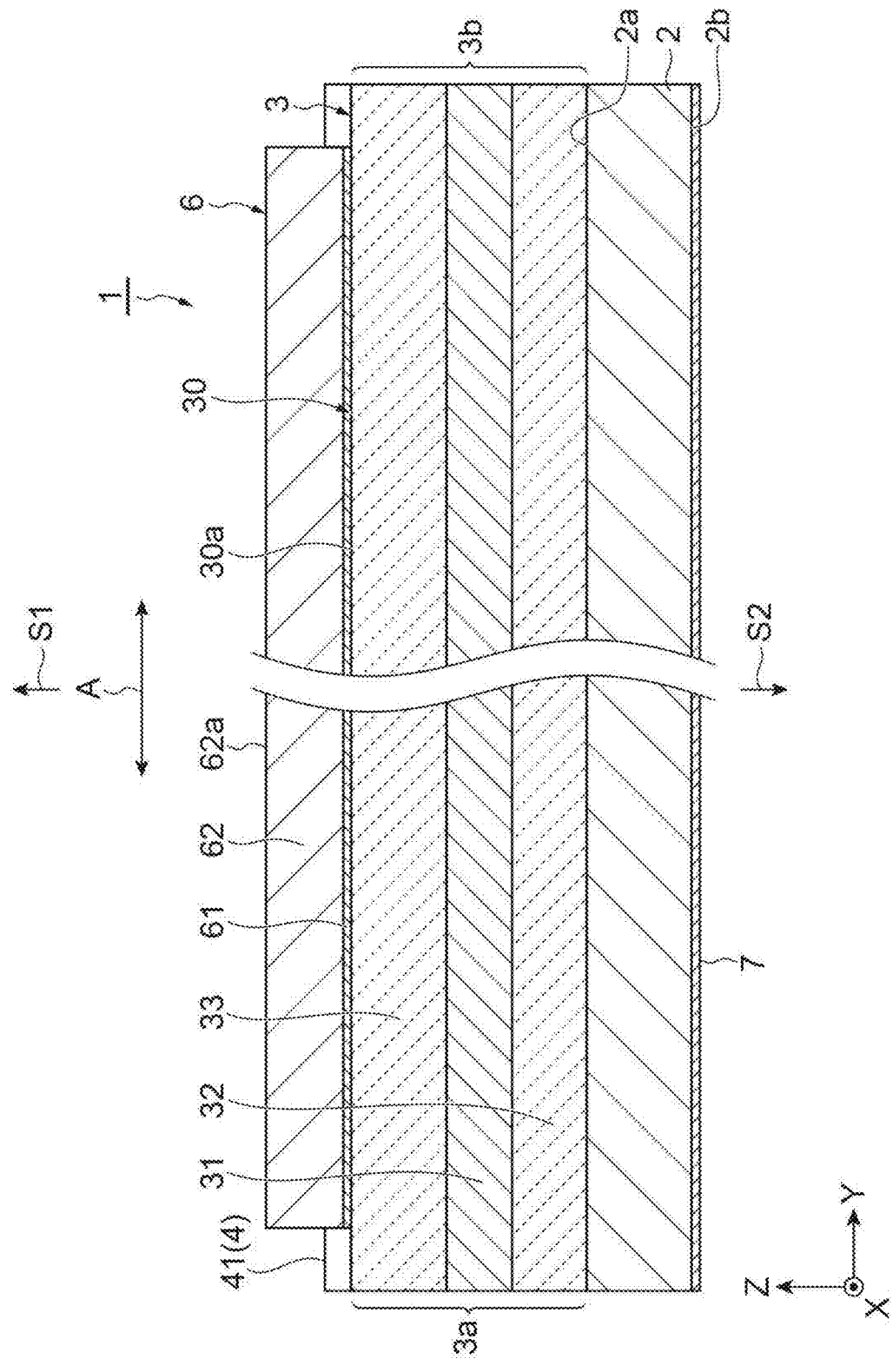
FIG. 2 is a cross-sectional view of the quantum cascade laser device along line II-II of FIG. 1.

As illustrated in FIGS. 1 and 2, the quantum cascade laser device 1 includes a semiconductor substrate 2, a semiconductor laminate 3, an embedded layer 4, a dielectric layer 5, a first electrode 6, and a second electrode 7.

The semiconductor substrate 2 may be, for example, an S-doped InP single crystal substrate having a rectangular plate shape. As an example, a length of the semiconductor substrate 2 is about 3 mm, a width of the semiconductor substrate 2 is about 500 μm, and a thickness of the semiconductor substrate 2 is about a hundred and several tens of micrometers. In the following description, a width direction of the semiconductor substrate 2 is referred to as an X-axis direction, a length direction of the semiconductor substrate 2 is referred to as a Y-axis direction, and a thickness direction of the semiconductor substrate 2 is referred to as a Z-axis direction. A side on which the semiconductor laminate 3 is positioned with respect to the semiconductor substrate 2 in the Z-axis direction is referred to as a first side S1, and a side on which the semiconductor substrate 2 is positioned with respect to the semiconductor laminate 3 in the Z-axis direction is referred to as a second side S2. The semiconductor substrate 2 is a low-doped InP substrate. For example, a doping concentration of impurities (S in this example) in the semiconductor substrate 2 may be less than $1 \times 10^{17}$ cm$^{-3}$. As an example, the doping concentration of impurities in the semiconductor substrate 2 is about substrate may be $5 \times 10^{16}$ cm$^{-3}$.

The semiconductor laminate 3 is formed on a surface 2a of the semiconductor substrate 2 on the first side S1. The semiconductor laminate 3 includes an active layer 31 having a quantum cascade structure. The semiconductor laminate 3 is configured to oscillate laser light having a center wavelength of 10 μm or more. In the present embodiment, the semiconductor laminate 3 is configured by laminating a lower clad layer 32 (second clad layer), a lower guide layer (not illustrated), the active layer 31, an upper guide layer (not illustrated), an upper clad layer 33 (first clad layer), and a contact layer (not illustrated) in this order from the semiconductor substrate 2 side. The upper guide layer has a diffraction grating structure that functions as a distributed feedback (DFB) structure.

The active layer 31 is provided on the semiconductor substrate 2 via the lower clad layer 32 and the lower guide layer. The active layer 31 has, for example, a multiple quantum well structure of InGaAs/InAlAs. A thickness of the active layer 31 may be, for example, 3 to 7 μm. As an example, a thickness of the active layer 31 is about 5.7 μm. Details of the active layer 31 will be described later.

The lower clad layer 32 may be, for example, a Si-doped InP layer. The lower clad layer 32 is provided on the semiconductor substrate 2 via the lower guide layer. That is, the lower clad layer 32 is provided between the active layer 31 and the semiconductor substrate 2. The lower clad layer 32 is configured as a low-doped InP layer having a larger thickness than usual. A thickness of the lower clad layer 32 may be, for example, 5 μm or more. As an example, the thickness of the lower clad layer 32 is about 5 μm. Here, the "thickness of the lower clad layer 32" indicates a thickness of a portion of the lower clad layer 32 between the semiconductor substrate 2 and the active layer 31 (that is, a portion overlapping the active layer 31 when viewed from the Z-axis direction). A doping concentration of impurities (Si in this example) in the lower clad layer 32 may be, for example, less than $1 \times 10^{17}$ cm$^{-3}$. As an example, the doping concentration of impurities in the lower clad layer 32 is about $4 \times 10^{16}$ cm$^{-3}$.

The upper clad layer 33 may be, for example, a Si-doped InP layer. The upper clad layer 33 is provided on a surface 31a of the active layer 31 on the first side S1 via the upper guide layer. That is, the upper clad layer 33 is provided on a side of the active layer 31 opposite to the semiconductor substrate 2 side. The upper clad layer 33 is configured as a low-doped InP layer having a larger thickness than usual as in the lower clad layer 32. A thickness of the upper clad layer 33 may be, for example, 5 μm or more. As an example, the thickness of the upper clad layer 33 is about 5 μm. A doping concentration of impurities (Si in this example) in the upper clad layer 33 may be, for example, less than $1 \times 10^{17}$ cm$^{-3}$. As an example, the doping concentration of impurities in the upper clad layer 33 is about $4 \times 10^{16}$ cm$^{-3}$.

The lower guide layer provided between the active layer 31 and the lower clad layer 32 may be, for example, a Si-doped InGaAs layer. A thickness of the lower guide layer may be, for example, about 0.20 μm. A doping concentration of impurities (Si in this example) in the lower guide layer may be, for example, about substrate may be $5 \times 10^{16}$ cm$^{-3}$.

The upper guide layer provided between the active layer 31 and the upper clad layer 33 may be, for example, a Si-doped InGaAs layer. A thickness of the upper guide layer may be, for example, about 0.45 μm. A doping concentration of impurities (Si in this example) in the upper guide layer may be, for example, about substrate may be $5 \times 10^{16}$ cm$^{-3}$.

The contact layer provided on a surface of the upper clad layer 33 on the first side S1 may be, for example, a Si-doped InGaAs layer. A thickness of the contact layer may be, for example, about 10 nm. A doping concentration of impurities (Si in this example) in the contact layer may be, for example, about $3 \times 10^{18}$ cm$^{-3}$.

The semiconductor laminate 3 includes a ridge part 30 extending in the Y-axis direction. The ridge part 30 is formed by a portion of the lower clad layer 32 on the first side S1, the lower guide layer, the active layer 31, the upper guide layer, the upper clad layer 33, and the contact layer. A width of the ridge part 30 in the X-axis direction is smaller than a width of the semiconductor substrate 2 in the X-axis direction. A length of the ridge part 30 in the Y-axis direction is equal to a length of the semiconductor substrate 2 in the Y-axis direction. As an example, the length of the ridge part 30 is about 3 mm, the width of the ridge part 30 is about 12 μm, and a thickness of the ridge part 30 is about 11 μm. The ridge part 30 is positioned at a center of the semiconductor substrate 2 in the X-axis direction. On both sides of the ridge part 30 in the X-axis direction, layers constituting the semiconductor laminate 3 are not present.

The ridge part 30 includes a top surface 30a and a pair of side surfaces 30b. The top surface 30a is a surface of the ridge part 30 on the first side S1. The pair of side surfaces 30b are surfaces on both sides of the ridge part 30 in the X-axis direction. In this example, each of the top surface 30a and the side surface 30b is a flat surface. A center line CL in FIG. 1 is a straight line that passes through a center (geometric center) of the ridge part 30 when viewed from the Y-axis direction and is parallel to the Z-axis direction. The quantum cascade laser device 1 is configured to be line-symmetrical with respect to the center line CL when viewed from the Y-axis direction.

The semiconductor laminate 3 has a first end surface 3a and a second end surface 3b which are opposite end surfaces of the ridge part 30 in an optical waveguide direction A. The optical waveguide direction A is a direction parallel to the Y-axis direction which is an extending direction of the ridge part 30. The first end surface 3a and the second end surface 3b function as light emitting end surfaces. The first end surface 3a and the second end surface 3b are respectively positioned on the same plane as opposite end surfaces of the semiconductor substrate 2 in the Y-axis direction.

The embedded layer 4 may be, for example, a semiconductor layer made of an Fe-doped InP layer. The embedded layer 4 includes a pair of first portions 41 and a pair of second portions 42. The pair of first portions 41 are formed on the pair of side surfaces 30b of the ridge part 30. The pair of second portions 42 extend in the X-axis direction from edge portions of the pair of first portions 41 on the second side S2. The second portions 42 are each formed on a surface 32a of the lower clad layer 32. The surface 32a is a surface on the first side S1 of a portion of the lower clad layer 32 that does not form the ridge part 30. A thickness of the first portion 41 may be, for example, about 1 to 2 μm. A thickness of the second portion 42 may be, for example, about 3 μm.

In the Z-axis direction, a surface 42a of the second portion 42 on the first side S1 is positioned between the surface 31a on the first side S1 and a surface 31b on the second side S2 of the active layer 31. In other words, when viewed from the X-axis direction, a part of the second portion 42 on the first side S1 overlaps a part of the active layer 31 on the second side S2.

The dielectric layer 5 may be, for example, an insulating layer made of a SiN film or a SiO$_2$ film. The dielectric layer 5 is formed on the surface 42a of an outer portion 42c of the second portion 42 so that the top surface 30a of the ridge part 30, the surface 41a of the first portion 41, and the surface 42a of an inner portion 42b of the second portion 42 are exposed from the dielectric layer 5. The inner portion 42b is a portion of the second portion 42 that is continuous with the first portion 41, and the outer portion 42c is a portion of the second portion 42 that is positioned on an outer side of the inner portion 42b in the X-axis direction.

The dielectric layer 5 is formed on the surface 42a of the outer portion 42c and is not formed on the surface 42a of the inner portion 42b. Thereby, the surface 42a of the inner portion 42b is exposed. In other words, an opening 5a for exposing the inner portion 42b is formed in the dielectric layer 5. The opening 5a exposes the top surface 30a of the ridge part 30, the surface 41a of the first portion 41, and the surface 42a of the inner portion 42b of the second portion 42 from the dielectric layer 5. An outer edge of the dielectric layer 5 reaches an outer edge of the embedded layer 4 in both the X-axis direction and the Y-axis direction. The dielectric layer 5 also functions as an adhesion layer that enhances adhesion between the embedded layer 4 and a metal layer 61 to be described later.

A width of the opening 5a in the X-axis direction may be, for example, twice or more a width of the active layer 31 in the X-axis direction. The width of the opening 5a in the X-axis direction may be five times or more the width of the active layer 31 in the X-axis direction. As an example, the width of the opening 5a in the X-axis direction is about 50 μm, and the width of the active layer 31 in the X-axis direction is about 9 μm. Further, although the width of the active layer 31 is constant in FIG. 1, the width of the active layer 31 can be formed in a tapered shape in which it narrows from the second side S2 toward the first side S1. In this case, the above-described "width of the active layer 31 in the X-axis direction" is a width of an end portion of the active layer 31 on the first side S1.

The width of the opening 5a in the X-axis direction may be 10 times or more a thickness of the embedded layer 4 in the Z-axis direction. Here, the "thickness of the embedded layer 4" is a thicker one of the thickness of the first portion 41 and the thickness of the second portion 42, and in this example, it is the thickness of the second portion (about 3 µm). That is, the width of the opening 5a may be 10 times or more the thickness of the second portion 42.

The first electrode 6 includes the metal layer 61 and a plating layer 62. The metal layer 61 may be, for example, a Ti/Au layer and functions as an underlayer for forming the plating layer 62. The plating layer 62 is formed on the metal layer 61. The plating layer 62 may be, for example, an Au plating layer. A thickness of the first electrode 6 in the Z-axis direction may be, for example, 6 µm or more.

The metal layer 61 is integrally formed to extend over the top surface 30a of the ridge part 30, and over the first portion 41 and the second portion 42 of the embedded layer 4. The metal layer 61 is in contact with the top surface 30a of the ridge part 30. Thereby, the first electrode 6 is electrically connected to the upper clad layer 33 via the contact layer. An outer edge of the metal layer 61 is positioned on an inner side of the outer edges of the embedded layer 4 and the dielectric layer 5 in both the X-axis direction and the Y-axis direction. A distance between the outer edge of the metal layer 61 and the outer edge of the dielectric layer 5 (outer edges of the semiconductor substrate 2, the semiconductor laminate 3, and the embedded layer 4) in the X-axis direction may be, for example, about 50 µm.

The metal layer 61 is formed directly on the first portion 41. That is, another layer (for example, a dielectric layer or an insulating layer) is not formed between the metal layer 61 and the first portion 41. The metal layer 61 is formed over the entire surface 41a of the first portion 41.

In the inner portion 42b of the second portion 42, the metal layer 61 is in contact with the surface 42a of the inner portion 42b via the opening 5a formed in the dielectric layer 5. In the outer portion 42c of the second portion 42, the metal layer 61 is formed over the second portion 42 via the dielectric layer 5. That is, the dielectric layer 5 is disposed between the outer portion 42c of the second portion 42 and the first electrode 6. When viewed from the Z-axis direction, an outer edge of the first electrode 6 is positioned on an inner side of the outer edges of the semiconductor substrate 2, the semiconductor laminate 3, the embedded layer 4, and the dielectric layer 5.

A plurality of wires 8 are electrically connected to a surface 62a of the plating layer 62 on the first side S1. The wires 8 may be formed by, for example, wire bonding, and are each electrically connected to the metal layer 61 via the plating layer 62. Connection positions between the first electrode 6 (the plating layer 62) and the wires 8 overlap the dielectric layer 5 when viewed from the Z-axis direction. Further, the number of wires 8 is not limited, and only one wire 8 may be provided.

The second electrode 7 is formed on a surface 2b of the semiconductor substrate 2 on the second side S2. The second electrode 7 may be, for example, an AuGe/Au film, an AuGe/Ni/Au film, or an Au film. The second electrode 7 is electrically connected to the lower clad layer 32 via the semiconductor substrate 2.

In the quantum cascade laser device 1, when a bias voltage is applied to the active layer 31 via the first electrode 6 and the second electrode 7, light is emitted from the active layer 31 and, among the light, light having a predetermined center wavelength is resonated in a distributed feedback structure. Thereby, the laser light having the predetermined center wavelength is emitted from the first end surface 3a and the second end surface 3b. Further, a high-reflection film may be formed on one end surface of the first end surface 3a and the second end surface 3b. In this case, the laser light having the predetermined center wavelength is emitted from the other end surface of the first end surface 3a and the second end surface 3b. Alternatively, a low-reflection film may be formed on one end surface of the first end surface 3a and the second end surface 3b. Also, a high-reflection film may be formed on the other end surface that is different from the end surface on which the low-reflection film is formed. In any of these cases, the laser light having the predetermined center wavelength is emitted from one end surface of the first end surface 3a and the second end surface 3b. In the former case, the laser light is emitted from both the first end surface 3a and the second end surface 3b.

The quantum cascade laser device 1 may constitute a quantum cascade laser device together with a drive unit that drives the quantum cascade laser device 1. The drive unit is electrically connected to the first electrode 6 and the second electrode 7. The drive unit may be, for example, a pulse drive unit that drives the quantum cascade laser device 1 so that the quantum cascade laser device 1 oscillates laser light in a pulsed manner.

[Configuration of Active Layer]

Figure 3:
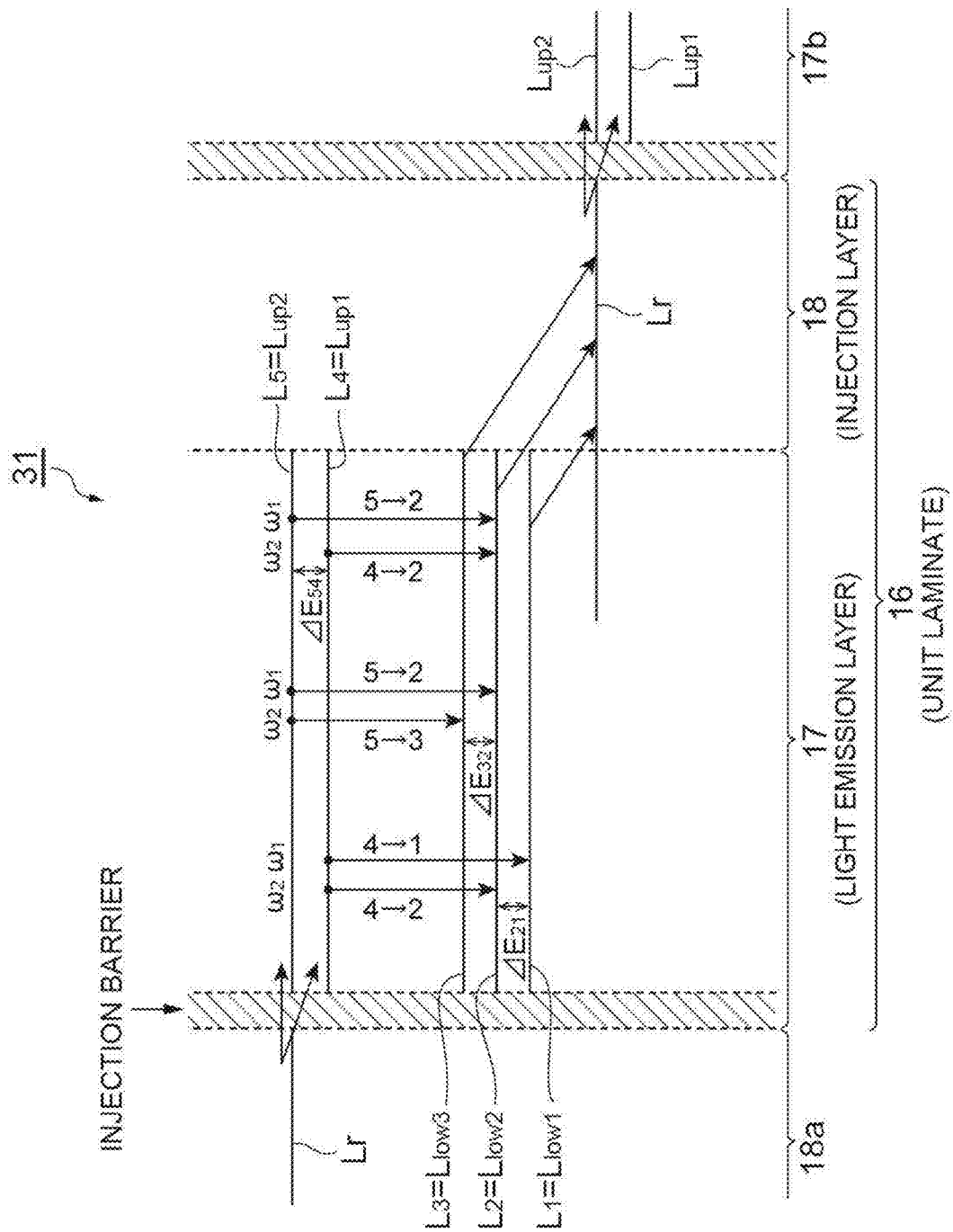
FIG. 3 is a diagram showing an example of a subband level structure in an active layer of the quantum cascade laser device.

As illustrated in FIG. 3, the active layer 31 has a cascade structure formed by laminating a unit laminate 16 in multiple stages. The unit laminate 16 includes a light emission layer 17 which generates light and an injection layer 18 to which electrons are transported from the light emission layer 17. The light emission layer 17 is a portion that mainly exhibits a light emitting function for generating light. The injection layer 18 is a portion that mainly exhibits an electron transport function of injecting electrons of the light emission layer 17 into an emission upper level of the light emission layer 17 of the unit laminate 16 in the subsequent stage. The light emission layer 17 and the injection layer 18 each have a quantum well structure in which quantum well layers and barrier layers are alternately laminated. Thereby, a subband level structure, which is an energy level structure due to the quantum well structure, is formed in each unit laminate 16.

The unit laminate 16 has a subband level structure of a combined dual-upper-level structure (DAU: dual-upper-state design) having two emission upper levels. In the example of FIG. 3, the unit laminate 16 has a subband level structure of a DAU/MS (dual-upper-state to multiple lower state) structure having two emission upper levels and a plurality (here, three) of emission lower levels. In the subband level structure, the unit laminate 16 has a first emission upper level (level 4) $L_{up1}$ ($L_4$) and a second emission upper level (level 5) $L_{up2}$ ($L_5$) which has an energy level higher than that of the first emission upper level. Further, in the subband level structure, the unit laminate 16 has a first emission lower level (level 1) $L_{low1}$ ($L_1$) which has an energy level lower than that of the first emission upper level, a second emission lower level (level 2) $L_{low2}$ ($L_2$) which has an energy level lower than that of the first emission upper level and higher than that of the first emission lower level, a third emission lower level (level 3) $L_{low3}$ ($L_3$) which has an energy level lower than that of the first emission upper level and higher than that of the second emission lower level, and a relaxation level Lr which is a lower energy level than these emission lower levels.

An injection barrier layer for electrons injected from an injection layer 18a into the light emission layer 17 is provided between the light emission layer 17 and the injection layer 18a of the unit laminate 16 of the previous stage. A barrier layer that is thin enough for wave functions to penetrate is provided between the light emission layer 17 and the injection layer 18. Further, an exit barrier layer for electrons exited from the light emission layer 17 to the injection layer 18 may be provided between the light emission layer 17 and the injection layer 18.

A spacing configuration of each level in the subband level structure of the unit laminate 16 is as follows. That is, an energy $\Delta E_{41}$ of emission transition (4→1) from the first emission upper level $L_{up1}$ to the first emission lower level $L_{low1}$ and an energy $\Delta E_{52}$ of emission transition (5→2) from the second emission upper level $L_{up2}$ to the second emission lower level $L_{low2}$ are each substantially coincident with an energy E1 of pump light having a first frequency $\omega 1$ ($\Delta E_{41}=\Delta E_{52}=E1$). Also, an energy $\Delta E_{42}$ of emission transition (4→2) from the first emission upper level $L_{up1}$ to the second emission lower level $L_{low2}$ and an energy $\Delta E_{53}$ of emission transition (5→3) from the second emission upper level $L_{up2}$ to the third emission lower level $L_{low3}$ are each substantially coincident with an energy E2 of pump light having a second frequency $\omega w2$ ($\Delta E_{42}=\Delta E_{53}=E2$). Further, an energy difference $\Delta E_{21}$ between the first emission lower level $L_{low1}$ and the second emission lower level $L_{low2}$, an energy difference $\Delta E_{32}$ between the second emission lower level $L_{low2}$ and the third emission lower level $L_{low3}$, and an energy difference $\Delta E_{54}$ between the first emission upper level $L_{up1}$ and the second emission upper level $L_{up2}$ are each substantially coincident with an energy E=E1−E2 of a terahertz wave having a difference frequency $\omega$ between the first frequency $\omega 1$ and the second frequency $\omega 2$ ($\Delta E_{21}=\Delta E_{32}=\Delta E_{54}=E$). In the present embodiment, the first frequency $\omega 1$ is larger than the second frequency w2, and the difference frequency is $\omega=\omega 1-\omega 2$.

In the subband level structure as described above, electrons are injected into the light emission layer 17 from the relaxation level Lr of the injection layer 18a of the previous stage via the injection barrier, and thereby the second emission upper level $L_{up2}$ that is coupled to the relaxation level Lr is strongly excited. At this time, sufficient electrons are also supplied to the first emission upper level $L_{up1}$ through a high-speed scattering process such as electron-electron scattering. That is, sufficient carriers are supplied to both the first emission upper level $L_{up1}$ and the second emission upper level $L_{up2}$.

Electrons injected into the first emission upper level $L_{up1}$ and the second emission upper level $L_{up2}$ transition to the first emission lower level $L_{low1}$, the second emission lower level $L_{low2}$, and the third emission lower level $L_{low3}$. At this time, light having energy corresponding to an energy difference between subband levels of an emission upper level and an emission lower level is generated and emitted. Particularly, a first pump light with the first frequency col having the energy E1 and a second pump light with the second frequency $\omega 2$ having the energy E2 are generated and emitted.

The electrons that have transitioned to the first emission lower level $L_{low1}$, the second emission lower level $L_{low2}$, and the third emission lower level $L_{low3}$ are relaxed to the relaxation level Lr. When electrons are pulled out from the first emission lower level $L_{low1}$, the second emission lower level $L_{low2}$, and the third emission lower level $L_{low3}$ in this way, population inversion for realizing laser oscillation is formed between the first emission upper level $L_{up1}$ and the second emission upper level $L_{up2}$, and the first emission lower level $L_{low1}$, the second emission lower level $L_{low2}$, and the third emission lower level $L_{low3}$. The electrons relaxed to the relaxation level Lr are injected into the first emission upper level $L_{up1}$ and the second emission upper level $L_{up2}$ of a light emission layer 17b in the subsequent stage in a cascade manner via the injection layer 18. Further, the relaxation level Lr is not limited to one configured by only one level and may be one configured by a plurality of levels or may be one configured by a mini band.

When the electron injection, the electron emission transition, and the electron relaxation as described above are repeated in a plurality of unit laminates 16 constituting the active layer 31, light generation in a cascade manner occurs in the active layer 31. When electrons move in the plurality of unit laminates 16 in a cascade manner, the first pump light having the first frequency $\omega 1$ and the second pump light having the second frequency $\omega 2$ are generated due to the emission transition between subbands of electrons in each of the unit laminates 16. Then, the terahertz wave having the difference frequency $\omega$ ($=|\omega 1-\omega 2|$) between the first frequency $\omega 1$ and the second frequency $\omega 2$ is generated by the difference-frequency generation due to Cherenkov phase matching.

Figure 4:
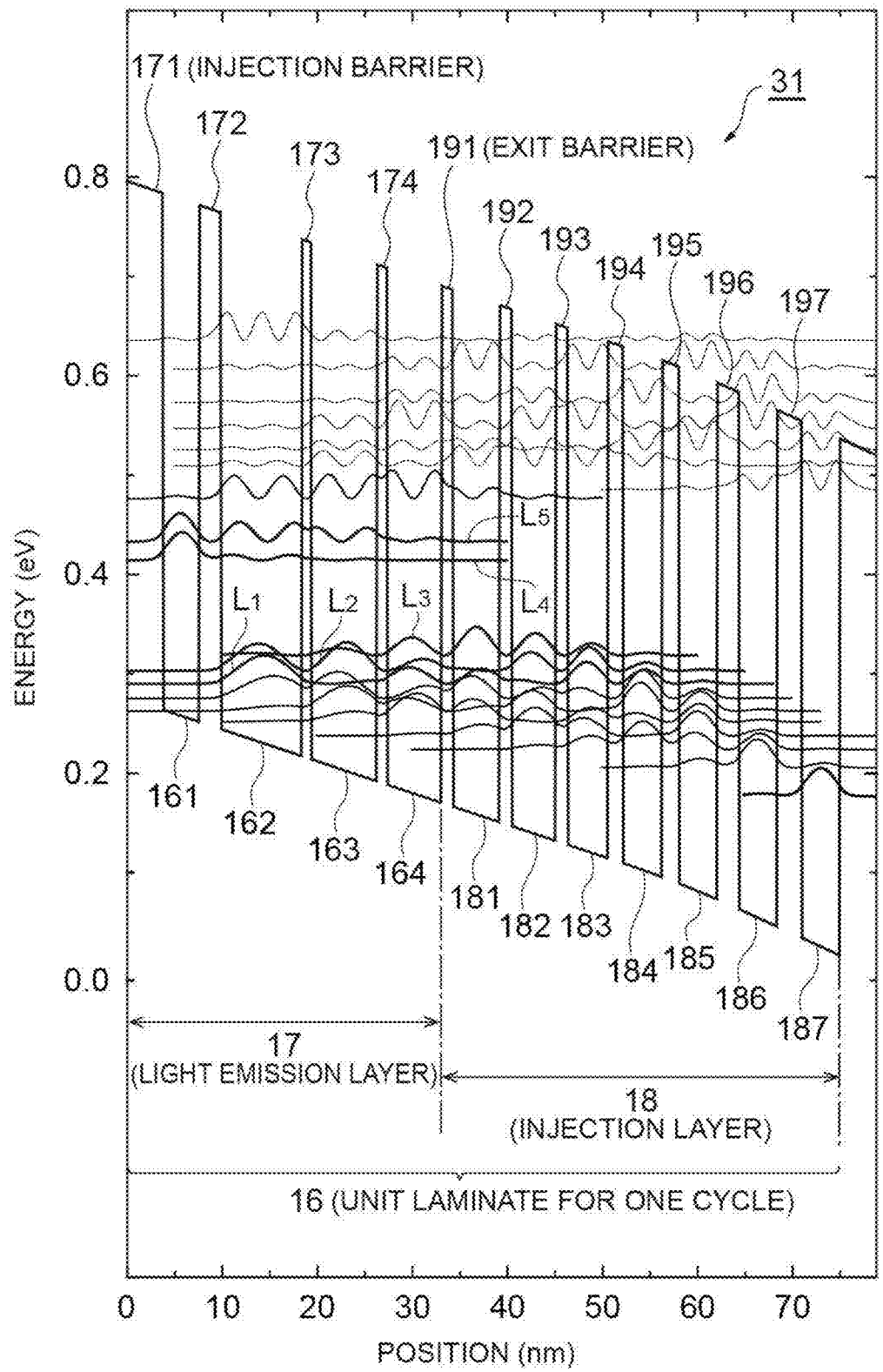
FIG. 4 is a diagram showing an example of a configuration of a unit laminate constituting the active layer.

The configuration of the active layer 31 will be further described with reference to FIGS. 4 and 5. Further, for a part of the repeated structure of the light emission layers 17 and the injection layers 18, quantum well structures and subband level structures thereof in an operating electric field are shown in FIG. 4.

In the present configuration example, the active layer 31 is formed such that the unit laminates 16 are laminated for 70 cycles, and a center wavelength of a gain in the active layer 31 is set to a predetermined wavelength of 10 μm or more. As an example, the unit laminate 16 for one cycle is configured as a quantum well structure by alternately laminating 11 quantum well layers (well layers 161 to 164 and 181 to 187) and 11 quantum barrier layers (barrier layers 171 to 174 and 191 to 197). The well layers 161 to 164 and 181 to 187 may be, for example, InGaAs layers, and the barrier layers 171 to 174 and 191 to 197 may be, for example, InAlAs layers.

In the unit laminate 16, a portion in which the four well layers 161 to 164 and the four barrier layers 171 to 174 are alternately laminated functions mainly as the light emission layer 17, and a portion in which the seven well layers 181 to 187 and the seven barrier layers 191 to 197 are alternately laminated functions mainly as the injection layer 18. The first-stage barrier layer 171 included in the light emission layer 17 functions as the injection barrier layer. Further, in the present configuration example, an exit barrier layer that effectively functions as an exit barrier is not provided between the light emission layer 17 and the injection layer 18. In the present configuration example, the barrier layer 191 is formally defined as an exit barrier layer, and the light emission layer 17 and the injection layer 18 are functionally divided before and after that.

In the active layer 31, in order to realize generation of a terahertz wave using the difference-frequency generation, it is necessary to be able to generate a pump light component having two wavelengths and to have a high second-order non-linear susceptibility $\chi^{(2)}$ for the pump light component having two wavelengths. For example, when two types of diffraction grating layers are provided in the upper guide layer, generation of the first pump light having the first frequency $\omega 1$ and the second pump light having the second frequency $\omega 2$, and generation of the terahertz wave having the difference frequency $\omega$ can be realized with a single active layer design. Further, when a quantum cascade laser device that outputs only either the first pump light or the second pump light is realized, one type of diffraction grating layer corresponding to the first pump light or the second pump light may be provided in the upper guide layer. In addition, these diffraction grating layers may be provided inside a clad layer (for example, the upper clad layer 33).

As shown in FIG. 4, the subband level structure of the present configuration example is designed so that electrons optically transition from the strongly coupled first emission upper level $L_4$ and second emission upper level $L_5$ to the first emission lower level $L_1$, the second emission lower level $L_2$, and the third emission lower level $L_3$. In the present configuration example, an energy spacing between the first emission upper level $L_4$ and the second emission upper level $L_5$ is $\Delta E_{54}=18$ meV. Energy spacings between the other levels are $\Delta E_{53}=121$ meV, $\Delta E_{52}=136$ meV, $\Delta E_{51}=149$ meV, $\Delta E_{43}=102$ meV, $\Delta E_{42}=117$ meV, and $\Delta E_{41}=131$ meV.

In the present configuration example, electrons injected from the injection layer 18 of the previous stage into the light emission layer 17 are equally distributed in the first emission upper level $L_4$ and the second emission upper level $L_5$ due to high-speed electron-electron scattering or the like, and the first emission upper level $L_4$ and the second emission upper level $L_5$ behave as if they were a spread single upper level. Therefore, a gain due to the electron transition from the first emission upper level $L_4$ to the first emission lower level $L_1$, the second emission lower level $L_2$, and the third emission lower level $L_3$, and a gain due to the electron transition from the second emission upper level $L_5$ to the first emission lower level $L_1$, the second emission lower level $L_2$, and the third emission lower level $L_3$ overlap each other with the same contribution, and a wideband emission spectrum with a single peak can be obtained.

In the configuration using a single active layer structure as described above, unlike a configuration using a structure of a plurality of laminated active layers, uniform nonlinear optical characteristics are obtained over the entire region of the active layer 31, and highly efficient wavelength conversion is realized. When carrier concentrations of the first emission lower level $L_1$, the second emission lower level $L_2$, the third emission lower level $L_3$, the first emission upper level $L_4$, and the second emission upper level $L_5$ are assumed to be n1 to n5 and it is assumed that n1=n2=n3, and when conditions $n_5-n_i=1.0\times10^{15}/cm^3$ and $n_4-n_i=1.3\times10^{15}/cm^3$ (i=1, 2, 3) are used, $|X^{(2)}|=23.3$ nm/V can be obtained as an absolute value of a sum of the second-order non-linear susceptibility $\chi^{(2)}$ generated by the DAU structure.

When the quantum cascade laser device 1 is configured as a terahertz wave optical device that outputs a terahertz wave, a design frequency $\omega$THz, the first frequency $\omega 1$, and the second frequency $\omega 2$ are determined by the DFB structure. A frequency of the terahertz wave that can be finally obtained is determined by $\omega$THz (=w1−w2). For example, the design frequency $\omega$THz may be determined to be about 3 THz. At this time, both the first frequency $\omega 1$ and the second frequency $\omega w2$ can be operated in a single mode using the DFB structure having two cycles, and thereby the terahertz wave can be operated in a single mode. In the present configuration example, a wavelength corresponding to at least one of light having the first frequency $\omega 1$, light having the second frequency $\omega 2$, and light having the difference frequency $\omega$THz (terahertz wave) is configured to be 10 μm or more.

[Effects]

In the quantum cascade laser device 1, a doping concentration of impurities (Si in this example) in the upper clad layer 33 adjacent to the active layer 31 is set to be less than $1\times10^{17}$ cm$^{-3}$. When the doping concentration of impurities in the upper clad layer 33 is reduced to be low as described above, an amount of light generated in the active layer 31 absorbed by the upper clad layer 33 by free carrier absorption can be effectively reduced. On the other hand, when the doping concentration of impurities in the upper clad layer 33 is lowered, since conductivity thereof deteriorates, there is a disadvantage in that it becomes difficult for a current to flow in the active layer 31 via the upper clad layer 33. Therefore, in the quantum cascade laser device 1, the DAU structure (the DAU/MS structure as an example in the present embodiment) as described above is employed as the active layer structure to compensate for such a disadvantage. In this subband level structure, a relatively low threshold current density is realized by the structure in which sufficient carriers are supplied to both of the two emission upper levels. That is, when the DAU structure is employed, the disadvantage caused by lowering the doping concentration of impurities in the upper clad layer 33 (that is, decrease in an amount of current flowing in the active layer 31) can be tolerated. As described above, when the DAU structure is employed and the doping concentration of impurities in the upper clad layer 33 is lowered, it is possible to effectively improve slope efficiency of light (light having a center wavelength of 10 μm or more) for which it has been difficult to obtain high light output performance (slope efficiency) in a conventional quantum cascade laser device.

Also, a thickness of the upper clad layer 33 may be 5 μm or more. When the thickness of the upper clad layer 33 is sufficiently increased in this way, the light generated in the active layer 31 can be effectively confined in the active layer 31. Thereby, light loss in the active layer 31 can be more effectively suppressed, and further improvement in the slope efficiency can be achieved.

Also, the doping concentration of impurities (S in this example) in the semiconductor substrate 2 may be less than $1\times10^{17}$ cm$^{-3}$. As described above, a low-doped InP substrate having a doping concentration of about $5\times10^{16}$ cm$^{-3}$ is used as the semiconductor substrate 2 in the present embodiment. When such a low-doped semiconductor substrate 2 is used, an amount of light absorbed by free carrier absorption in the semiconductor substrate 2 can be effectively reduced. As a result, the light loss in the active layer 31 can be more effectively suppressed, and further improvement in the slope efficiency can be achieved.

Also, the quantum cascade laser device 1 may further include the lower clad layer 32 provided between the active layer 31 and the semiconductor substrate 2 and having a doping concentration of impurities (Si in this example) of less than $1\times10^{17}$ cm$^{-3}$. When the lower clad layer 32 is provided between the active layer 31 and the semiconductor substrate 2, light generated in the active layer 31 can be effectively confined in the active layer 31. Further, when the doping concentration of impurities is reduced to be low also in the lower clad layer 32 as in the upper clad layer 33, the light loss in the active layer 31 can be more effectively suppressed, and further improvement in the slope efficiency can be achieved.

Also, a thickness of the lower clad layer 32 may be 5 μm or more. When the thickness of the lower clad layer 32 is sufficiently increased in this way, the light generated in the active layer 31 can be more effectively confined in the active layer 31. Thereby, the light loss in the active layer 31 can be more effectively suppressed, and further improvement in the slope efficiency can be achieved.

Also, the quantum cascade laser device 1 may be configured as a so-called vertical conduction type device. Specifically, the quantum cascade laser device 1 may include the first electrode 6 provided on a side in which the active layer 31 is disposed with respect to the semiconductor substrate 2

(that is, the first side S1) and electrically connected to the upper clad layer 33, and the second electrode 7 provided on a side opposite to the first electrode 6 with the semiconductor substrate 2 interposed therebetween (that is, the second side S2) and electrically connected to the semiconductor substrate 2. The doping concentration of impurities in the semiconductor substrate 2 may be $5 \times 10^{15}$ cm$^{-3}$ or more and less than $1 \times 10^{17}$ cm$^{-3}$. In this case, when the electrodes (the first electrode 6 and the second electrode 7) are disposed on both sides (that is, the first side S1 and the second side S2) with the semiconductor substrate 2 sandwiched therebetween, a current can be caused to flow in the active layer 31 via the semiconductor substrate 2. Thereby, a manufacturing process of the quantum cascade laser device can be simplified compared to a structure (a so-called side contact structure) in which a current is caused to flow only in components on a side in which the active layer 31 is provided with respect to the semiconductor substrate 2 (that is, the first side S1) without causing a current to flow in the semiconductor substrate 2. Also, when the doping concentration of impurities (S in this example) in the semiconductor substrate 2 is set to $5 \times 10^{15}$ cm$^{-3}$ or more and less than $1 \times 10^{17}$ cm$^{-3}$, a current required for driving the quantum cascade laser device 1 can be appropriately caused to flow via the semiconductor substrate 2 while reducing an amount of light absorbed by the free carrier absorption in the semiconductor substrate 2.

Specifically, in the side contact structure, an electrode electrically connected to the lower clad layer 32 is provided as an electrode in place of the second electrode 7. In order to provide such an electrode, for example, it may be necessary to provide, for example, a contact layer (for example, a Si-doped InGaAs layer) between the semiconductor substrate 2 and the lower clad layer 32. Also, in order to electrically connect the contact layer and the above-described electrode, it is necessary to form a contact hole at a part of the embedded layer 4 and the dielectric layer 5 at a portion in which the first electrode 6 is not provided. Further, in such a side contact structure, both the first electrode 6 and the above-described electrode (the electrode provided in place of the second electrode 7) are disposed on the first side S1 of the semiconductor substrate 2. Therefore, it is also necessary to assemble the electrode members and the like with high accuracy so that these electrodes do not come into contact with each other. On the other hand, when the quantum cascade laser device 1 is configured as the vertical conduction type device as in the present embodiment, the manufacturing process can be simplified compared to the side contact structure described above. Also, according to the vertical conduction type, a drive voltage can be reduced compared to that in the side contact structure.

EXAMPLE

Figure 6:
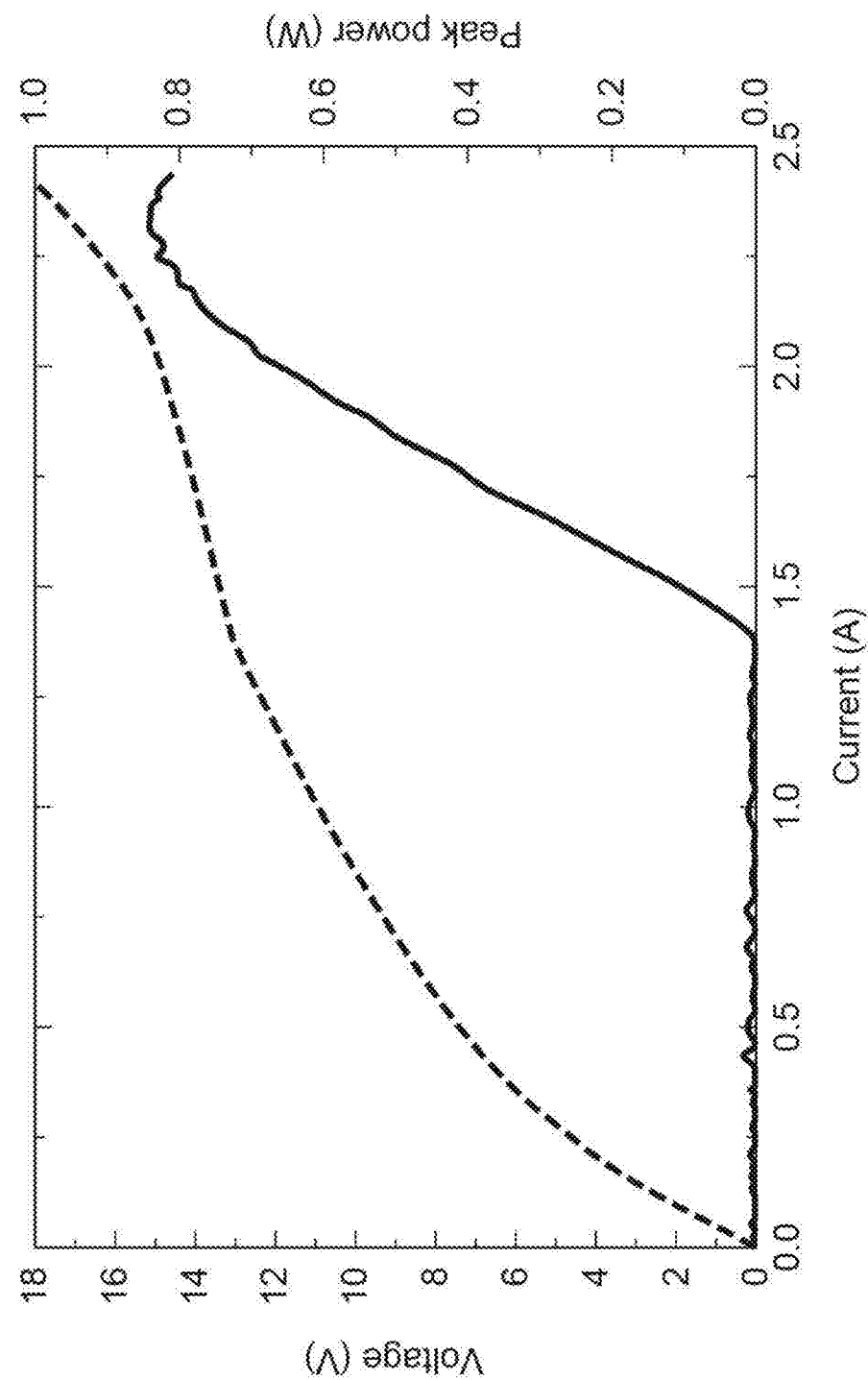
FIG. 6 is a graph showing current-light output characteristics of the quantum cascade laser device according to an example.

FIG. 6 is a graph showing current-light output characteristics of an example (that is, the quantum cascade laser device 1 described above). The solid line in the graph indicates a light output (W), and the broken line in the graph indicates a drive voltage (V). Further, in the example, a high-reflection film was formed on one end surface of the first end surface 3a and the second end surface 3b, and thereby light was emitted from the other end surface (emission surface) of the first end surface 3a and the second end surface 3b. Also, in the example, it was configured such that light having a center wavelength of 12.9 μm was emitted from the above-described emission surface by providing a diffraction grating layer corresponding to the wavelength of 12.9 μm to the semiconductor laminate 3 (the upper guide layer). Also, structures and slope efficiencies disclosed in comparative examples (Non-Patent Documents 2 to 5 described above) are as follows. As shown in FIG. 6, a high slope efficiency (about 1 W/A) was ascertained in example with respect to the following comparative examples 1 to 4.

Comparative Example 1: Non-Patent Document 2

Active layer structure: BTC structure
Thickness of an upper clad layer (InP): 1.75 μm
Doping concentration of impurities in the upper clad layer: $6 \times 10^{16}$ cm$^{-3}$
Thickness of a lower clad layer (InP): 0.6 μm
Doping concentration of impurities in the lower clad layer: $6 \times 10^{16}$ cm$^{-3}$
Doping concentration of impurities in a semiconductor substrate (InP): $1 \times 10^{17}$ cm$^{-3}$
Wavelength of output light: about 16 μm
Slope efficiency: about 20 mW/A
Comparative Example 2: Non-Patent Document 3
Active layer structure: iDP structure
Thickness of an upper clad layer (InP): 5 μm
Doping concentration of impurities in the upper clad layer: $5 \times 10^{16}$ cm$^3$
Thickness of a lower clad layer (InP): 5 μm
Doping concentration of impurities in the lower clad layer: $5 \times 10^{16}$ cm$^3$
Doping concentration of impurities in a semiconductor substrate (InP): $1 \times 10^{18}$ cm$^{-3}$
Wavelength of output light: about 14 to 15.5 μm
Slope efficiency: about 346 mW/A Comparative Example 3: Non-Patent Document 4

Active layer structure: two phonon-continuum structure
Thickness of an upper clad layer (InP): 2.4 μm
Doping concentration of impurities in the upper clad layer: $5 \times 10^{16}$ cm$^{-3}$
Lower clad layer (InP): none (function of lower clad is replaced by a semiconductor substrate)
Semiconductor substrate (InP): doping concentration of impurities: $1 \times 10^{17}$ cm$^{-3}$
Wavelength of output light: about 14 μm
Slope efficiency: about 375 mW/A
Comparative Example 4: Non-Patent Document 5
Active layer structure: BTC structure
Thickness of an upper clad layer (InP): 4 μm
Doping concentration of impurities in the upper clad layer: $5.5 \times 10^{16}$ cm$^{-3}$
Thickness of a lower clad layer (InP): 4 μm
Doping concentration of impurities in the lower clad layer: $5.5 \times 10^{16}$ cm$^{-3}$
Semiconductor substrate structure: unknown
Wavelength of output light: about 13.8 μm
Slope efficiency: about 200 mW/A Modified Example Although one embodiment of the present disclosure has been described above, the present disclosure is not limited to the above-described embodiment. The material and shape of each configuration are not limited to the above-described material and shape, and various materials and shapes can be employed.

For example, one type of diffraction grating layer may be provided in the semiconductor laminate 3 (the upper guide layer), or three or more types of diffraction grating layers may be provided in the semiconductor laminate 3. The diffraction grating layer that functions as the distributed feedback structure may be any diffraction grating layer as long as it oscillates at least one of the first pump light and the second pump light in a single mode.

Also, the active layer 31 is not limited to the configuration including only one type of unit laminate 16 illustrated in FIGS. 3 to 5 and may include two or more types of active layer structures (unit laminates). Also, the lower clad layer 32 may be omitted. In this case, a part of the semiconductor substrate 2 (a portion adjacent to the active layer 31) may function as the clad layer.

Also, in the above-described embodiment, the active layer 31 having a configuration that is lattice-matched with the InP single crystal substrate has been exemplified, but the active layer 31 may be one using a configuration in which distortion compensation is introduced. Also, the semiconductor material system of the active layer 31 is not limited to the above-described InGaAs/InAlAs, and various semiconductor material systems such as, for example, GaAs/AlGaAs, InAs/AlSb, GaN/AlGaN, and SiGe/Si can be applied. Also, various methods can be applied to a semiconductor crystal growth method.

Further, the quantum cascade laser device is not limited to the vertical conduction type as in the above-described embodiment and may have the side contact structure. Also in this case, the same effect as that of the quantum cascade laser device 1 described above can be obtained by employing the DAU structure as the active layer structure and employing at least one of the above-described configurations (mainly thicknesses and doping concentrations) of the upper clad layer 33, the lower clad layer 32, and the semiconductor substrate 2. Also, when the side contact structure is employed, since it is not necessary to cause a current to flow in the semiconductor substrate, a semi-insulator substrate which is not doped with impurities can be used as the semiconductor substrate. Thereby, absorption loss of output light in the semiconductor substrate can be effectively reduced.

Also, the outer edge of the metal layer 61 in the Y-axis direction may reach the outer edges of the embedded layer 4 and the dielectric layer 5. In this case, heat dissipation on the first end surface 3a and the second end surface 3b can be improved. The side surfaces 30b of the ridge part 30 may extend parallel to the center line CL. The metal layer 61 may be configured to include a plurality of portions separated from each other. For example, the metal layer 61 on the first portion 41 may be provided separately from the metal layer 61 on the second portion 42.

Also, the first electrode 6 may be formed only by the metal layer 61 without the plating layer 62 being provided. In this case, the wire 8 may be connected to the surface of the metal layer 61 on the first side S1. In the above-described embodiment, the inner portion 42b of the second portion 42 is exposed from the dielectric layer 5 and the metal layer 61 is in contact with the inner portion 42b, but a part of the second portion 42 may be exposed from the dielectric layer 5 and the metal layer 61 may be in contact with the second portion 42 at the part. In the above-described embodiment, a part of the surface 62a of the plating layer 62 is positioned on the second side S2 of the top surface 30a of the ridge part 30, but the entire surface 62a of the plating layer 62 may be positioned on the first side S1 of the top surface 30a. For example, the surface 62a may be planarized by polishing after the plating layer 62 is formed by plating so that the entire surface 62a is positioned on the first side S1 of the top surface 30a.

REFERENCE SIGNS LIST

1 Quantum cascade laser device
2 Semiconductor substrate
6 First electrode
7 Second electrode
16 Unit laminate
17, 17b Light emission layer
18, 18a Injection layer
31 Active layer
32 Lower clad layer (second clad layer)
33 Upper clad layer (first clad layer)
$L_{up1}$ First emission upper level
$L_{up2}$ Second emission upper level
$L_{low1}$ First emission lower level (emission lower level)
$L_{low2}$ Second emission lower level (emission lower level)
$L_{low3}$ Third emission lower level (emission lower level)

What is claimed is:

1. A quantum cascade laser device comprising:
a semiconductor substrate that includes a first surface and a second surface opposite to the first surface;
an active layer provided on the first surface of the semiconductor substrate and in which a cascade structure in which a light emission layer and an injection layer are alternately laminated is formed by laminating a unit laminate including the light emission layer and the injection layer in multiple stages;
a first clad layer provided on a side of the active layer opposite to the semiconductor substrate side and having a doping concentration of impurities of less than $1 \times 10^{17}$ cm$^{-3}$;
a first electrode provided on a side in which the active layer is disposed with respect to the semiconductor substrate and electrically connected to the first clad layer; and
a second electrode provided on the second surface of the semiconductor substrate and electrically connected to the semiconductor substrate, wherein
the unit laminates included in the active layer each include, in their subband level structure:
a first emission upper level;
a second emission upper level having an energy level higher than that of the first emission upper level; and
at least one emission lower level having an energy level lower than that of the first emission upper level,
the active layer is configured to generate light having a center wavelength of 10 μm or more due to electron transition between at least two levels of the first emission upper level, the second emission upper level, and the at least one emission lower level in the light emission layer in each of the unit laminates,
a doping concentration of impurities in the semiconductor substrate is $5 \times 10^{15}$ cm$^{-3}$ or more and less than $1 \times 10^{17}$ cm$^{-3}$, and
where the second surface overlaps with the active layer in a thickness direction of the semiconductor substrate, the entire second surface is formed flat.

2. The quantum cascade laser device according to claim 1, wherein a thickness of the first clad layer is 5 μm or more.

3. The quantum cascade laser device according to claim 1, further comprising a second clad layer provided between the active layer and the semiconductor substrate and having a doping concentration of impurities of less than $1 \times 10^{17}$ cm$^{-3}$.

4. The quantum cascade laser device according to claim 3, wherein a thickness of the second clad layer is 5 μm or more.

* * * * *